(12) United States Patent
Liao

(10) Patent No.: US 7,787,839 B2
(45) Date of Patent: Aug. 31, 2010

(54) RFIC WITH DYNAMICALLY CONTROLLED POWER AMPLIFIER

(75) Inventor: Hsin-Hsing Liao, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 664 days.

(21) Appl. No.: 11/787,293

(22) Filed: Apr. 16, 2007

(65) Prior Publication Data

US 2008/0139128 A1    Jun. 12, 2008

Related U.S. Application Data

(60) Provisional application No. 60/868,878, filed on Dec. 6, 2006, provisional application No. 60/868,881, filed on Dec. 6, 2006, provisional application No. 60/868,818, filed on Dec. 6, 2006.

(51) Int. Cl.
*H01Q 11/12* (2006.01)
*H04B 1/04* (2006.01)

(52) U.S. Cl. ............... 455/127.1; 455/115.4; 455/129
(58) Field of Classification Search ... 455/115.1–115.4, 455/117, 127.1, 126, 129
See application file for complete search history.

(56) References Cited

U.S. PATENT DOCUMENTS

| 7,209,718 B2* | 4/2007 | Lindell ........................ 455/126 |
| 7,379,714 B2* | 5/2008 | Haque et al. ................ 455/107 |
| 7,546,137 B2* | 6/2009 | D'Hont et al. .............. 455/522 |

\* cited by examiner

*Primary Examiner*—Edward Urban
*Assistant Examiner*—Christian A Hannon
(74) *Attorney, Agent, or Firm*—Garlick Harrison & Markison

(57) ABSTRACT

A radio frequency (RF) front-end includes a power amplifier module and a power amplifier control module. The power amplifier module is coupled to amplify an outbound RF signal in accordance with a control signal to produce an amplified outbound RF signal. The power amplifier control module is coupled to generate the control signal based on at least one of forward power of the amplified outbound RF signal and reflected power of the amplified outbound RF signal.

10 Claims, 6 Drawing Sheets

RFIC WITH DYNAMICALLY CONTROLLED POWER AMPLIFIER

This patent application is claiming priority under 35 USC §119 to three provisionally filed patent applications:
(1) METHOD AND SYSTEM FOR SIGNAL PROCESSING IN WIRELESS COMMUNICATIONS, having a provisional filing date of Dec. 6, 2006, and a provisional Ser. No. 60/868,818;
(2) FUNCTIONALITIES OF A CHIP, having a provisional filing date of Dec. 6, 2006, and a provisional Ser. No. 60/868,881; and
(3) METHOD AND SYSTEM FOR SIGNAL PROCESSING, having a provisional filing date of Dec. 6, 2006, and a provisional Ser. No. 60/868,878.

CROSS REFERENCE TO RELATED PATENTS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to wireless communication systems and more particularly to wireless communication devices having an integrated circuit operating within such systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

An issue with the above described transmitters is providing a power amplifier that has sufficient gain and power and that can be implemented on an integrated circuit (IC). Another issue is protecting the power amplifier when it is providing a relatively high level of power from damage that may be caused by an impedance mismatch. A known solutions for minimizing this latter issue includes providing an impedance matching circuit. While this reduces an impedance mismatch, mismatches may still occur as the operating frequency changes, as the transmit power requirements change, and/or as the antenna configuration changes.

Therefore, a need exists for an integrated circuit (IC) that includes a dynamically controlled power amplifier.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
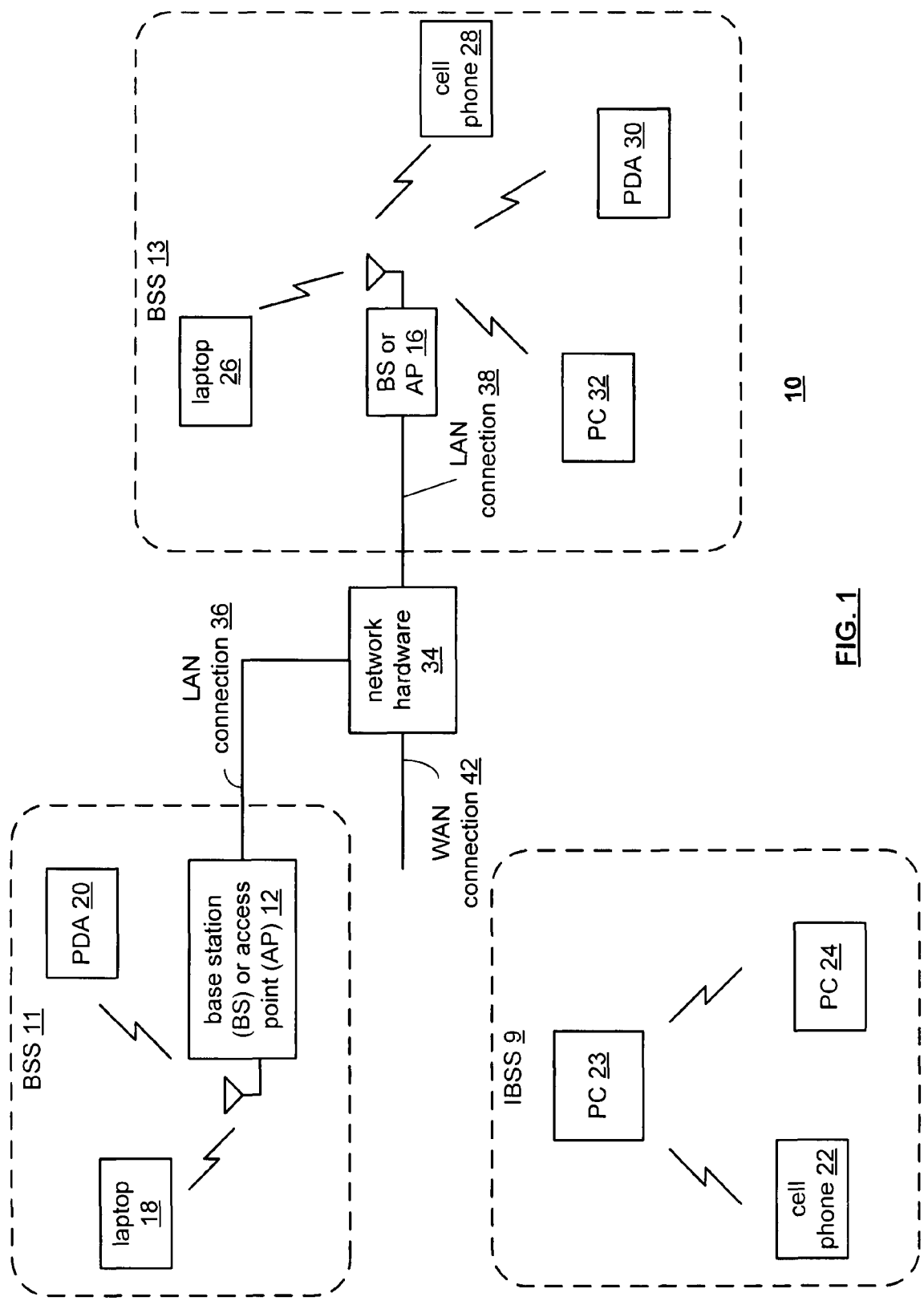
FIG. 1 is a schematic block diagram of an embodiment of a wireless communication system in accordance with the present invention.

FIG. 1 is a schematic block diagram illustrating a communication system 10 that includes a plurality of base stations and/or access points 12, 16, a plurality of wireless communication devices 18-32 and a network hardware component 34. Note that the network hardware 34, which may be a router, switch, bridge, modem, system controller, et cetera provides a wide area network connection 42 for the communication system 10. Further note that the wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIGS. 2-6.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12 16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
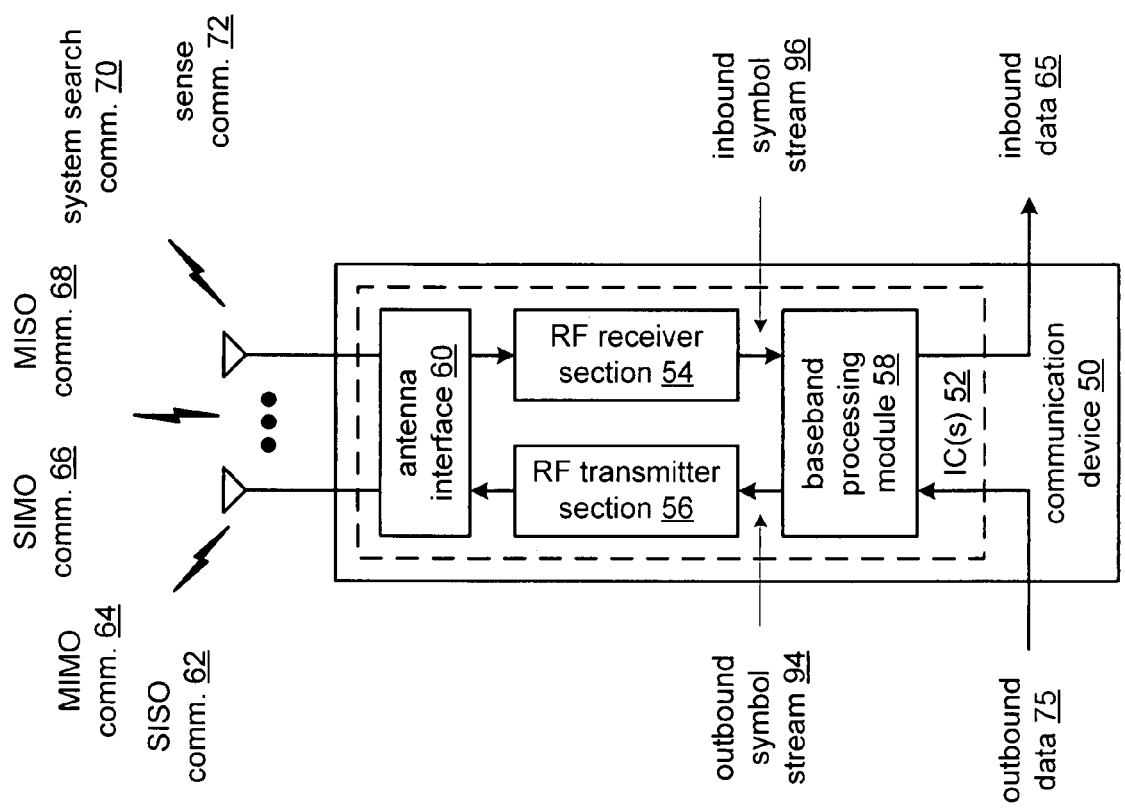
FIG. 2 is a schematic block diagram of an embodiment of a wireless communication device in accordance with the present invention.

FIG. 2 is a schematic block diagram of an embodiment of wireless communication device 50, which may be one of the communication devices 18-32 of FIG. 1 or may be another type of wireless communication device. The wireless communication device 50 includes one or more integrated circuit (IC) 52 coupled to an antenna interface 60. The one or more ICs 52 includes a radio frequency (RF) receiver section 54, an RF transmitter section 56, and a baseband processing module 58. The antenna interface 60 is coupled to an antenna system that may include one or more antennas to provide a diversity antenna structure, to provide an in-air beamforming structure, to provide a polarized antenna structure, to provide a multiple input multiple output (MIMO) communication 64 antenna structure, to provide a single input single output (SISO) communication 62 antenna structure, to provide a single input multiple output (SIMO) communication 66 antenna structure, to provide a multiple input single output (MISO0 communication 68 antenna structure, to provide a system search communication 70 (e.g., attempting authorization and/or association with a system) antenna structure, and/or to provide carrier sense communication 72 (e.g., detect an incoming wireless communication) antenna system.

The baseband processing module 58 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/ or operational instructions corresponding to at least some of the steps and/or functions illustrated in FIGS. 2 and 6.

The baseband processing module 58 converts outbound data 75 (e.g., a voice signal, data, a text file, an audio file, a video file, an image file, and/or a combination thereof) into an outbound symbol stream, or streams, 94 in accordance with a wireless communication protocol (e.g., IEEE 802.11 a, b, g, n, etc., Bluetooth, ZigBee, GSM, CDMA, WCDMA, EDGE, GPRS, HSDPA, HSUPA, etc.). The baseband processing module 58 also converts an inbound symbol stream, or streams, 96 into inbound data 65 (e.g., a voice signal, data, a text file, an audio file, a video file, an image file, and/or a combination thereof). Note that the baseband processing module 58 generates multiple outbound symbol streams from the outbound data when it is functioning in accordance with IEEE 802.11n, when it is performing baseband beamforming, and/or another type of multiple output communication protocol.

The RF receiver section 54 converts an inbound RF signal, or signals, into the inbound symbol stream, or streams, 96 based on a receive local oscillation. The RF transmitter section 56 is coupled to convert the outbound symbol stream, or streams, 94 into an outbound RF signal, or signals.

In an embodiment, the RF transmitter section 56 includes a power amplifier module as will be described in greater detail with reference to FIGS. 3-6. Such an RF transmitter section 56 may include circuitry to protect the power amplifier module from damage due to mismatches when it is transmitting at higher power levels.

Figure 3:
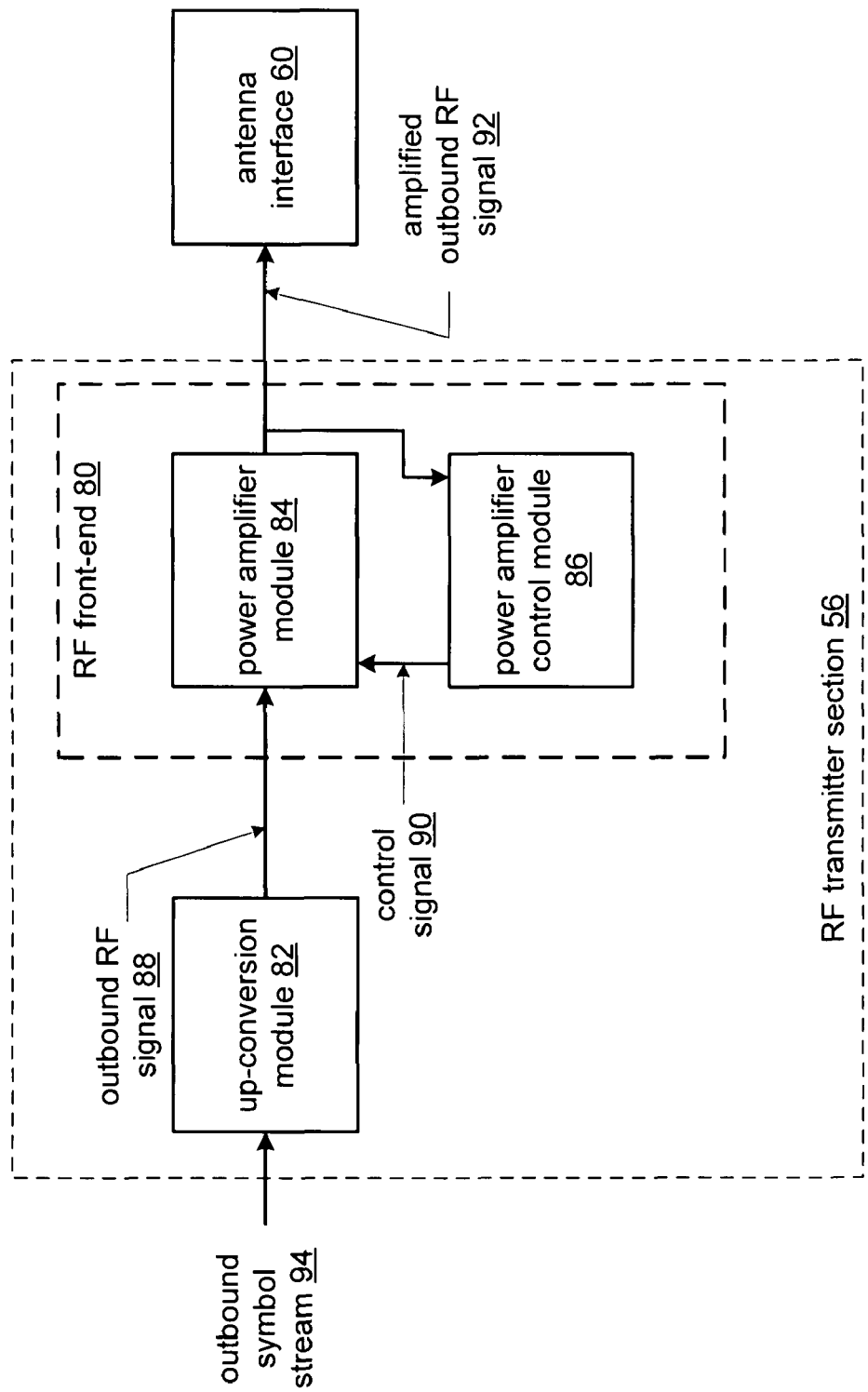
FIG. 3 is a schematic block diagram of an embodiment of an RF transmitter section in accordance with the present invention.

FIG. 3 is a schematic block diagram of an embodiment of an RF transmitter section 56 that includes an up-conversion module 82 and an RF front-end 80. The RF front-end 80 includes a power amplifier module 84 and a power amplifier control module 86.

The up conversion module 82 is coupled to convert the analog representation of the outbound symbol stream, or streams, 94 into an outbound RF signal, or signals, 88 based on the transmit local oscillation. In an embodiment, the up conversion module 82 may include one or more pair of mixers and a combining circuit and may further adjust its gain, its load, its frequency response, etc. in accordance with an up conversion control signal.

The power amplifier module 84, which may include one or more power amplifier drivers and power amplifiers coupled in series and/or in parallel, is coupled to amplify the outbound RF signal 88 in accordance with a control signal 90 to produce an amplified outbound RF signal 92. The power amplifier control module 86 is coupled to generate the control signal 90 based on at least one of forward power of the amplified outbound RF signal and reflected power of the amplified outbound RF signal 90. The control signal 90 may cause the power amplifier module 84 to shut down, to adjust is transmit power level, to adjust its biasing level, and/or to adjust an operational parameter (e.g., linearity, 3 dB compression point, gain, load, etc.).

The RF front-end 80 provides the amplified outbound RF signal 92 to the antenna interface 60. In an embodiment, the antenna interface 60 includes a transmission line, impedance matching circuitry, and/or a transformer balun.

Figure 4:
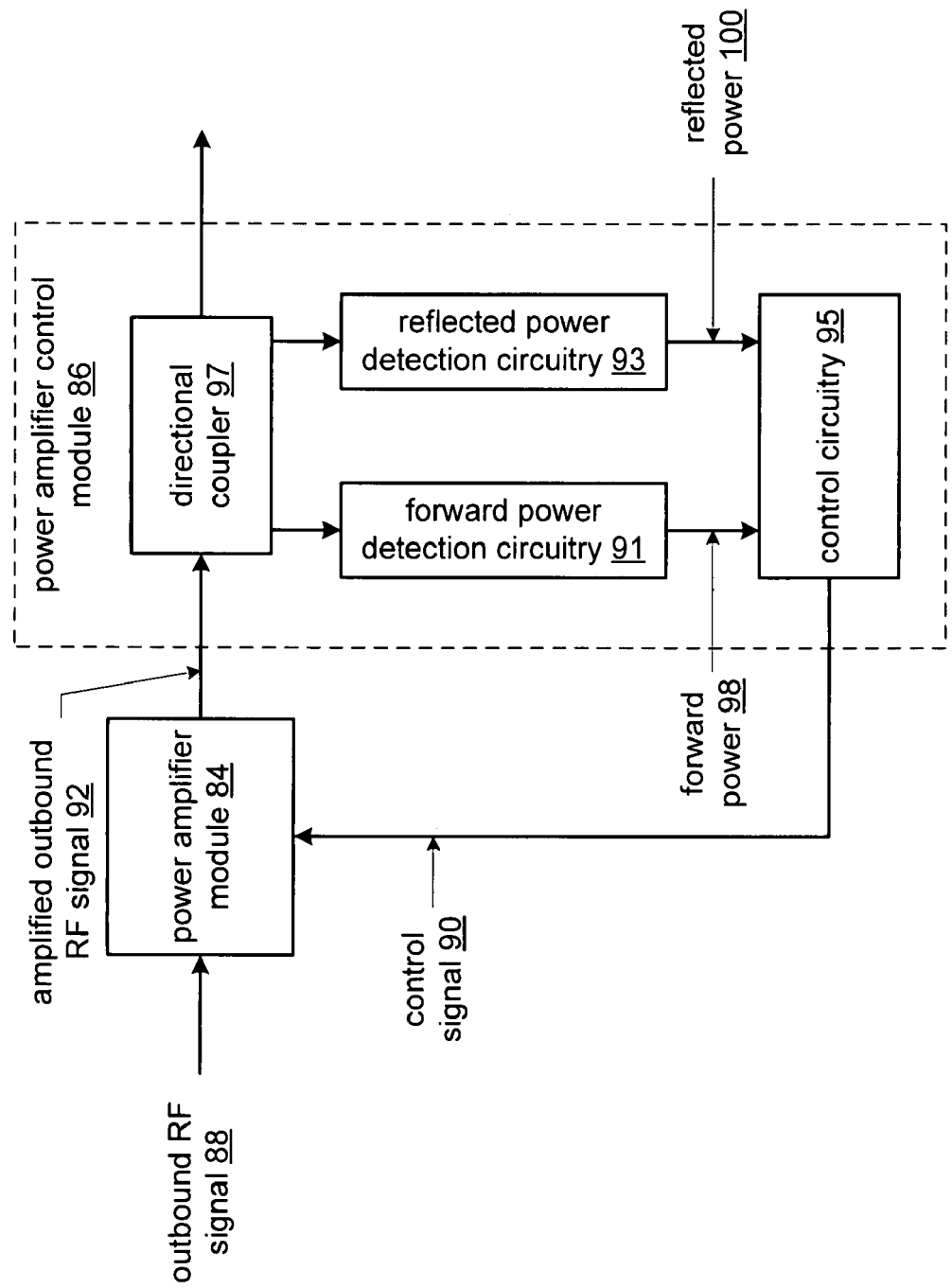
FIG. 4 is a schematic block diagram of an embodiment of an RF front-end in accordance with the present invention.

FIG. 4 is a schematic block diagram of an embodiment of an RF front-end 80 that includes the power amplifier module 84 and the power amplifier control module 86. The power amplifier control module 86 includes a directional coupler 97, forward power detection circuitry 91, reflected power detection circuitry 93, and control circuitry 95. The directional coupler 97 provides the amplified outbound RF signal 92 via a transmitted port to an antenna structure, provides a representation of the amplified outbound RF signal 92 via a coupled port to the forward power detection circuitry 91, and provides another representation of the amplified outbound RF signal 92 via an isolated port to the reflected power detection circuitry 93.

The forward power detection circuitry 91 detects the forward power 98 of the amplified outbound RF signal 92 based on the representation of the amplified outbound RF signal 92 it receives from the directional coupler 97. The reflected power detection circuitry 93 detects the reflected power 100 of the amplified outbound RF signal 92 based on the other representation of the amplified outbound RF signal 92 it receives from the directional coupler 97. Note that the reflected power 100 is a measure of the mismatch between the RF transmitter and the antenna system.

The control circuitry 95 generates the control signal 90 based on the at least one of the forward power 98 and the reflected power 100. In one embodiment, the control circuitry 95 generates the control signal 90 to turn off the power amplifier module 84 when the reflected power 100 compares unfavorably to a reflected power threshold. In another embodiment, the control circuitry 95 determines a difference between the forward power 98 and the reflected power 100 and generates the control signal 90 to adjust output impedance of the power amplifier module 84 to reduce the difference. In another embodiment, the control circuitry 95 generates the control signal 90 to adjust biasing of the power amplifier module 84 based on the forward power 98.

Figure 5:
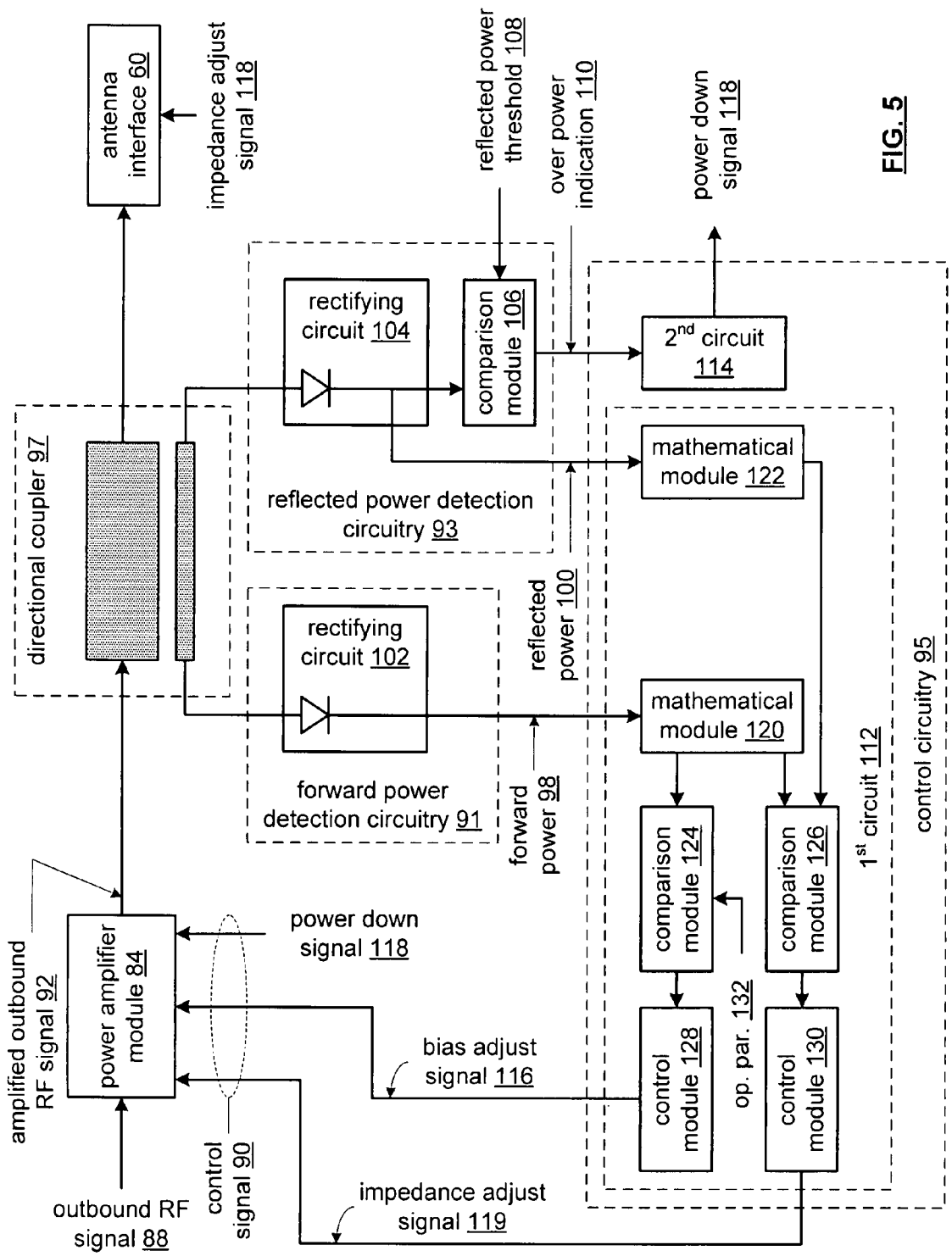
FIG. 5 is a schematic block diagram of another embodiment of an RF front-end in accordance with the present invention.

FIG. 5 is a schematic block diagram of another embodiment of an RF front-end 80 that includes the power amplifier module 84 and the power amplifier control module 86. The power amplifier control module 86 includes a directional coupler 97, forward power detection circuitry 91, reflected power detection circuitry 93, and control circuitry 95. The forward power detection circuitry 91 may include a rectifying circuit 102. The reflected power detection circuitry 93 may include a rectifying circuit 104 and a comparison module 106. The control circuitry 95 may include a first circuit 112 and a second circuit 114. The first circuit 112 may include mathematical modules 120 and/or 122, comparison modules 124 and/or 126, and/or control modules 128 and/or 130.

The directional coupler 97 is a passive device that may be included in the antenna interface 60 as at least part of the transmission line. The directional coupler 97 has four ports: input, transmitted, coupled, and isolated. In this embodiment, the input port is coupled to receive the amplified outbound RF signal 92 from the power amplifier module 94; the transmitted port is coupled to output the amplified outbound RF signal 92 to the antenna interface 60; the coupled port is coupled to the forward power detection circuitry 91, and the isolated port is coupled to the reflected power detection circuitry 93.

In an embodiment, the forward rectifying circuit 120, which may include a diode, a transistor, and/or a rectifier, is coupled to rectify the amplified outbound RF signal 92 received from the directional coupler 97 to produce a rectified forward outbound RF signal. Note that the rectified amplified outbound RF signal is representative of the forward power 98.

The reflected rectifying circuit 104, which may include a diode, a transistor, and/or a rectifier, is coupled to rectify the amplified outbound RF signal 92 outputted by the directional coupler 97 to produce a rectified reflected outbound RF signal, which is representative of the reflected power. The comparison module 106 compares the rectified reflected outbound RF signal with a reflected power threshold 108. When the rectified reflected outbound RF signal compares unfavorably with the reflected power threshold, the comparison module 106 outputs an over power indication 110. The second circuit 114 generates the control signal 90 to include a power down signal 118 that is based on the over power indication 110. In this instance, when the reflected power is above a desired level, the power amplifier module 84 can be shut down to avoid damage caused by the excessive reflected power. Note that the reflected power threshold 108 may be dependent upon a setting for the transmit power level of the amplified outbound RF signal 92.

In another embodiment, the first circuit 112 generate the control signal 90 as a bias adjust signal 116 based on an interpretation of the rectified forward outbound RF signal. To accomplish this, the first circuit may include a mathematical module 120, a comparison module 124, and a control module 128. The mathematical module 120 generates a mathematical representation of the rectified forward outbound RF signal. Such a mathematical representation may be done by performing an averaging function, a root mean square (RMS) function, an envelope detection function, a signal strength function, a logarithmic function, and/or a least mean square (LMS) function.

The comparison module 124 compares the mathematical representation of the rectified forward power with operational parameters 132 of the power amplifier module 84. The operational parameters 132 include one or more of linearity, 3 dB compression point, gain, load, etc. As such, for a given operating condition, if the actual operating parameter does not substantially match the empirical operating parameter, the comparison module 124 outputs an indication of the failed comparison.

The control module 128 generates the control signal 90 as the bias adjust signal 116 based on the output of the comparison module 124. For example, if the forward transmit power is to be at a given level and it is not, the comparison module 124 may determine that the gain of the power amplifier module 84 is too low. From this indication, the control module 128 generates the bias adjust signal 116 to increase the gain of the power amplifier module 84.

In another embodiment, the first circuit 112 generate the control signal 90 as an impedance adjust signal 119 based on an interpretation of the rectified forward outbound RF signal. To accomplish this, the first circuit may include a mathematical module 122, a comparison module 126, and a control module 130. The mathematical module 122 generates a mathematical representation of the rectified reflected outbound RF signal. Such a mathematical representation may be done by performing an averaging function, a root mean square (RMS) function, an envelope detection function, a signal strength function, a logarithmic function, and/or a least mean square (LMS) function.

The comparison module 126 compares the mathematical representation of the rectified reflected power with the mathematical representation of the rectified forward power. In an embodiment, the comparison module 126 is comparing the mathematical representations to determine whether the forward power is near a maximum power for the current output power setting and the reflected power is near a minimum power for the current power setting. If so, no impedance adjustments are needed. If, however, the reflected power and the forward power are not at the desired levels (e.g., deviate from the desired value for the current setting by a few percent or more), then there is an impedance mismatch.

The control module 130 generates the control signal 90 as the impedance adjust signal 119 based on the output of the comparison module 126. For example, if the comparison module 126 detects an impedance mismatch, the control module 130 generates the impedance adjust signal 119 to adjust the output impedance of the power amplifier module 84 and/or to adjust the impedance of the antenna interface 60 to reduce the impedance mismatch.

Figure 6:
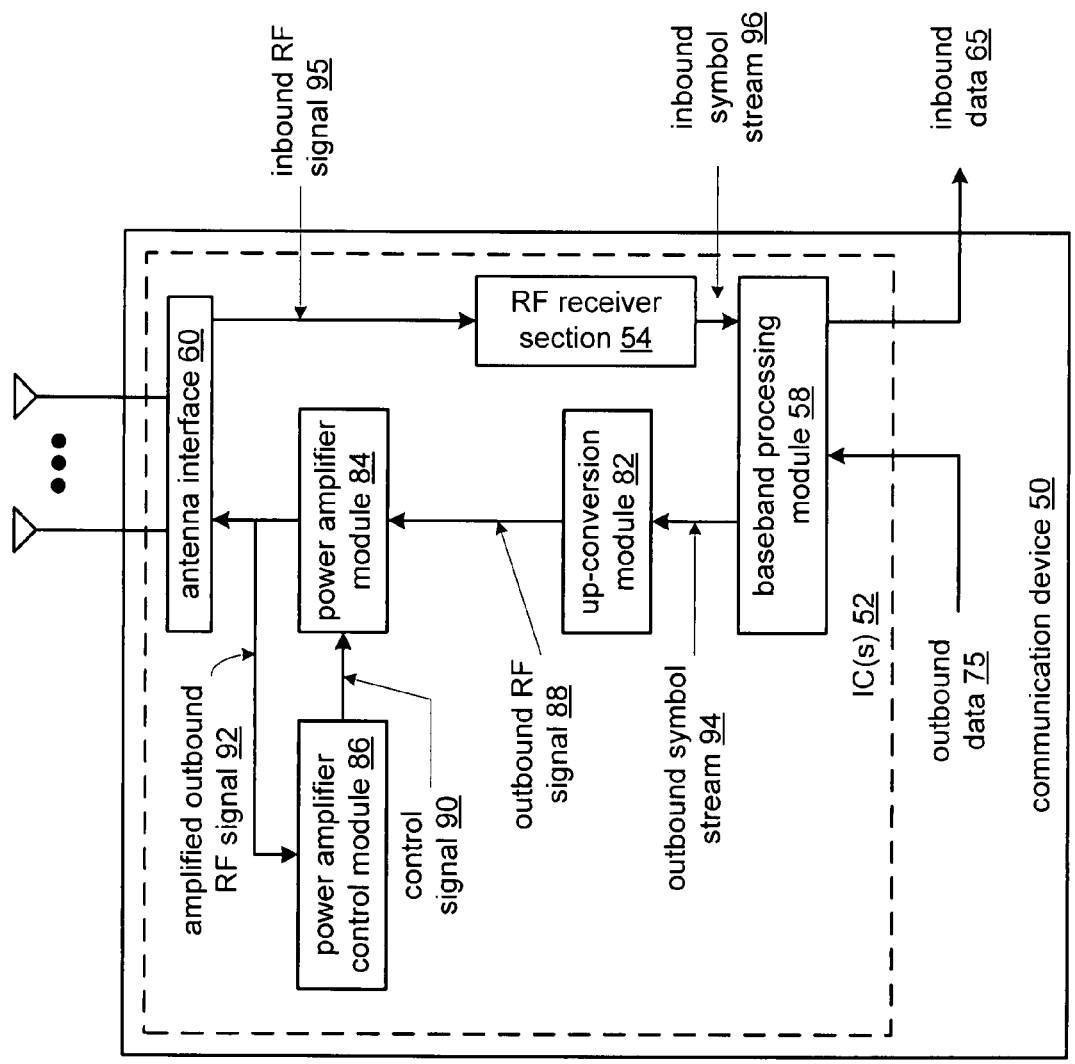
FIG. 6 is a schematic block diagram of another embodiment of a wireless communication device in accordance with the present invention.

FIG. 6 is a schematic block diagram of another embodiment of a wireless communication device 50 that includes one or more ICs 52 and an antenna system. The IC 52 includes a radio frequency (RF) receiver section 54, a baseband processing module 58, an antenna interface 60, an up-conversion module 82, a power amplifier module 84, and a power amplifier control module 86. Each of these components operates as previously discussed with reference to FIGS. 2-5.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A radio frequency (RF) front-end comprises:
a power amplifier module coupled to amplify an outbound RF signal in accordance with a control signal to produce an amplified outbound RF signal; and
power amplifier control module coupled to generate the control signal based on at least one of forward power of the amplified outbound RF signal and reflected power of the amplified outbound RF signal, the power amplifier control module including:
a first rectifying circuit coupled to rectify the amplified outbound RF signal to produce a rectified forward outbound RF signal, wherein the rectified forward outbound RF signal is representative of the forward power;
a second rectifying circuit coupled to rectify the amplified outbound RF signal to produce a rectified reflected outbound RF signal, wherein the rectified reflected outbound RF signal is representative of the reflected power;
a first comparison module coupled to compare the rectified reflected outbound RF signal with a reflected power threshold and to output an over power indication when the rectified reflected outbound RF signal compares unfavorably with the reflected power threshold;
a first control circuit to generate the control signal as a bias adjust signal based on an interpretation of the rectified forward outbound RF signal; and
a second control circuit to generate the control signal as a power down signal for the power amplifier module based on the over power indication.

2. The RF front-end of claim 1, wherein the power amplifier control module includes a directional coupler coupled to provide the amplified outbound RF signal to an antenna structure and also coupled to the first and second rectifying circuits.

3. The RF front-end of claim 2, wherein the first control circuit further functions to:
determine a difference between the forward power and the reflected power based on the rectified forward outbound RF signal and rectified reflected outbound RF signal; and
generate the control signal as an impedance adjust signal to adjust output impedance of the power amplifier module.

4. The RF front-end of claim 3, wherein the first control circuit further includes:
a first mathematical module to generate a mathematical representation of the rectified forward outbound RF signal; and
a second comparison module coupled to compare the mathematical representation of the rectified forward outbound RF signal with operational parameters of the power amplifier module;
wherein, the bias adjust signal is based on the comparison of the mathematical representation of the rectified forward outbound RF signal with operational parameters of the power amplifier module.

5. The RF front-end of claim 4, wherein the first control circuit further includes:
a second mathematical module to generate a mathematical representation of the rectified reflected outbound RF signal; and
a third comparison module coupled to compare the mathematical representation of the rectified forward outbound RF signal with the mathematical representation of the rectified reflected outbound RF signal
wherein, the impedance adjust signal is based on the comparison of the mathematical representation of the rectified forward outbound RF signal with the mathematical representation of the rectified reflected outbound RF signal.

6. A radio frequency integrated circuit (RFIC) comprises:
a baseband processing module coupled to:
convert outbound data into an outbound symbol stream in accordance with a wireless communication protocol; and
convert an inbound symbol stream into inbound data in accordance with the wireless communication protocol;
a receiver section coupled to convert an inbound radio frequency (RF) signal into the inbound symbol stream in accordance with a receiver local oscillation;
an up-conversion module coupled to convert the outbound symbol stream into an outbound RF signal in accordance with a transmitter local oscillation;
a power amplifier module coupled to amplify an outbound RF signal in accordance with a control signal to produce an amplified outbound RF signal; and
power amplifier control module coupled to generate the control signal based on at least one of forward power of the amplified outbound RF signal and reflected power of the amplified outbound RF signal, the power amplifier control module including:
a first rectifying circuit coupled to rectify the amplified outbound RF signal to produce a rectified forward outbound RF signal, wherein the rectified forward outbound RF signal is representative of the forward power;
a second rectifying circuit coupled to rectify the amplified outbound RF signal to produce a rectified reflected outbound RF signal, wherein the rectified reflected outbound RF signal is representative of the reflected power;

a first comparison module coupled to compare the rectified reflected outbound RF signal with a reflected power threshold and to output an over power indication when the rectified reflected outbound RF signal compares unfavorably with the reflected power threshold;

a first control circuit to generate the control signal as a bias adjust signal based on an interpretation of the rectified forward outbound RF signal; and a second control circuit to generate the control signal as a power down signal for the power amplifier module based on the over power indication.

7. The RFIC of claim 6, wherein the power amplifier control module includes a directional coupler coupled to provide the amplified outbound RF signal to an antenna structure and also coupled to the first and second rectifying circuits.

8. The RFIC of claim 7, wherein the first control circuit further functions to:

determine a difference between the forward power and the reflected power based on the rectified forward outbound RF signal and rectified reflected outbound RF signal; and generate the control signal as an impedance adjust signal to adjust output impedance of the power amplifier module.

9. The RFIC of claim 8, wherein the first control circuit further includes:

a first mathematical module to generate a mathematical representation of the rectified forward outbound RF signal; and a second comparison module coupled to compare the mathematical representation of the rectified forward outbound RF signal with operational parameters of the power amplifier module wherein the bias adjust signal is based on the comparison of the mathematical representation of the rectified forward outbound RF signal with operational parameters of the power amplifier module.

10. The RFIC of claim 9, wherein the first control circuit further includes:

a second mathematical module to generate a mathematical representation of the rectified reflected outbound RF signal; and a third comparison module coupled to compare the mathematical representation of the rectified forward outbound RF signal with the mathematical representation of the rectified reflected outbound RF signal;

wherein, the impedance adjust signal is based on the comparison of the mathematical representation of the rectified forward outbound RF signal with the mathematical representation of the rectified reflected outbound RF signal.

* * * * *